United States Patent [19]

Reed

[11] 4,301,658
[45] Nov. 24, 1981

[54] CONTROL CIRCUITRY FOR THERMOELECTRIC COOLER

[75] Inventor: Michael A. Reed, Tucson, Ariz.

[73] Assignee: Koolatron Industries, Ltd., Barrie, Canada

[21] Appl. No.: 102,447

[22] Filed: Dec. 11, 1979

[51] Int. Cl.³ .................... F25B 21/02; G08B 21/00
[52] U.S. Cl. ........................................ 62/3; 62/126; 62/129; 165/26; 340/663
[58] Field of Search ............................ 62/3, 126, 129; 340/663, 585; 236/91 G; 165/26

[56] References Cited

U.S. PATENT DOCUMENTS

| | | | |
|---|---|---|---|
| 3,149,471 | 9/1964 | Boehmer et al. | 62/3 |
| 3,232,063 | 1/1966 | Eichhorn et al. | 62/3 |
| 3,332,807 | 7/1967 | Boehmer et al. | 62/3 |
| 3,616,846 | 11/1971 | Wills | 165/26 |
| 3,733,836 | 5/1973 | Corini | 62/3 |
| 3,736,765 | 6/1973 | O'Dell | 340/585 |
| 3,939,421 | 11/1974 | Barringer et al. | 340/663 |
| 3,944,889 | 3/1976 | Conway | 340/663 |
| 4,007,600 | 2/1977 | Simms | 62/3 |
| 4,040,565 | 8/1977 | Christiansen | 236/91 G |
| 4,167,858 | 9/1979 | Kojima et al. | 62/126 |

Primary Examiner—William E. Wayner
Assistant Examiner—Harry Tanner
Attorney, Agent, or Firm—Cahill, Sutton and Thomas

[57] ABSTRACT

A portable cooler includes a urethane foam shell having a storage compartment and fan recess. An internal heat exchanger is mounted to a wall of the storage compartment and conducts heat out of the storage compartment by means of a thermally conductive block to an external heat exchanger mounted in the fan recess. An electric fan mounted in the fan recess blows outside air through fins of the external heat exchanger. A grill covers the fan recess. A solid state thermoelectric device is disposed between the external heat exchanger and the thermally conductive block. A control circuit includes a first thermistor which senses the temperature of the internal heat exchanger. A comparator having one input coupled to a temperature control reostat and another input coupled to the first thermistor controls a switch circuit which connects the terminals of the thermoelectric device and the terminals of the fan motor to a supply voltage conductor. A manual switch can be actuated to reverse the direction of current through the thermoelectric device, causing heating, rather than cooling, of the storage compartment. A protective circuit senses the temperature of a second thermistor located near the external heat exchanger and prevents the switch circuit from energizing the thermoelectric device and the fan motor if the external exchanger becomes overheated. An under-voltage indicator circuit causes a light emitting diode to be turned on if a proper polarity and level of battery voltage is applied to the supply voltage conductor, and causes the light emitting diode to blink if the battery voltage is less than a predetermined level.

11 Claims, 13 Drawing Figures

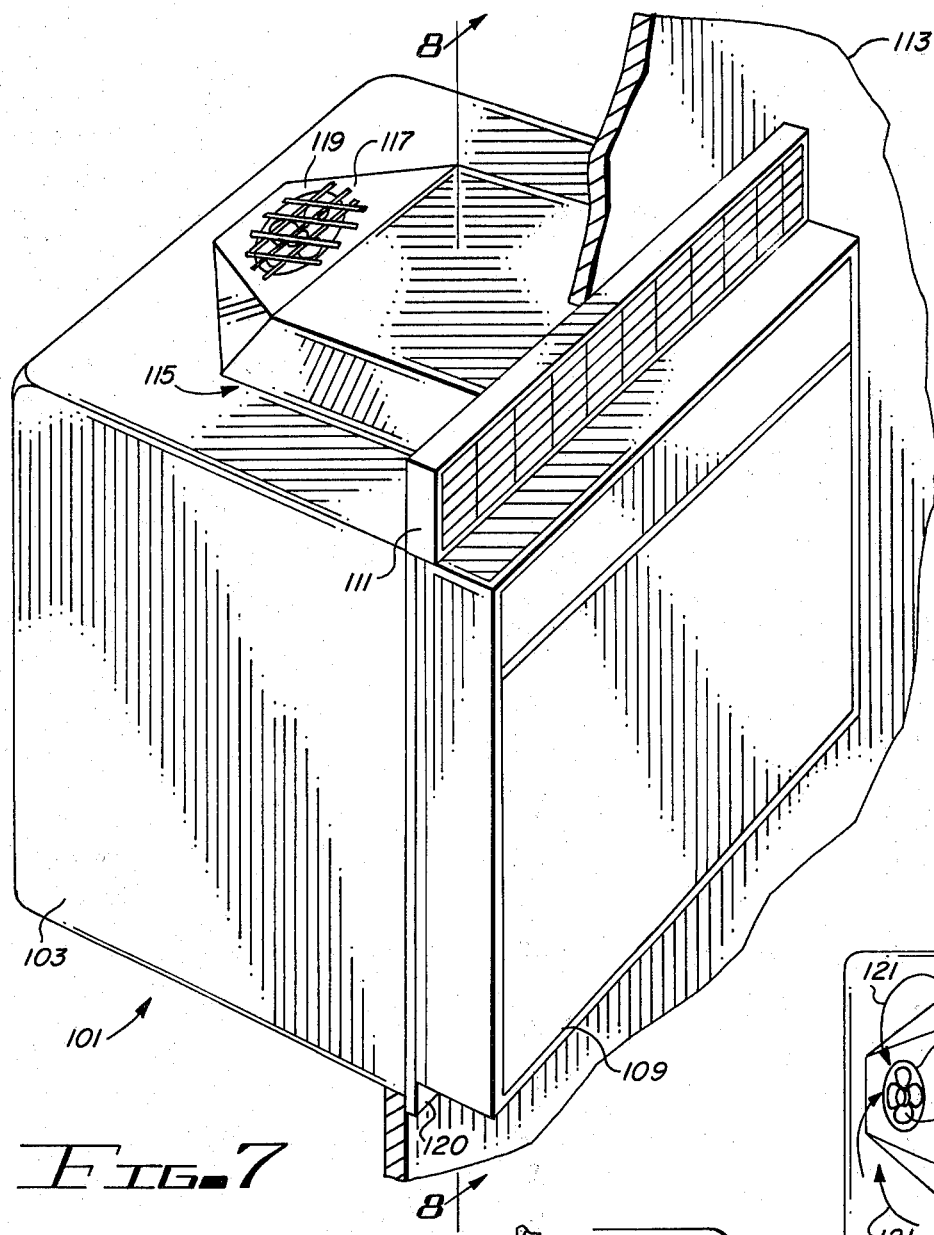
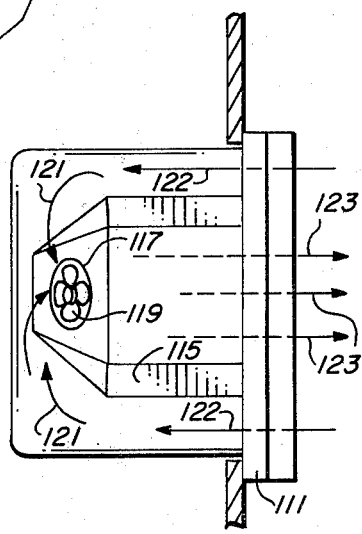
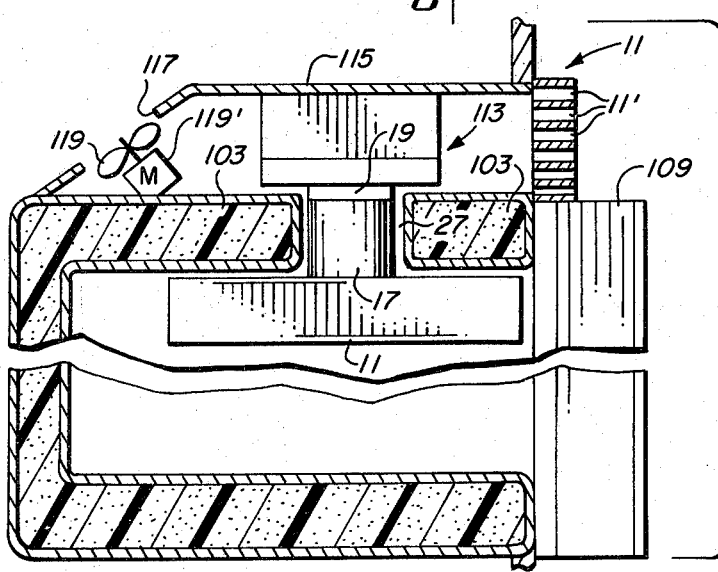

CONTROL CIRCUITRY FOR THERMOELECTRIC COOLER

BACKGROUND OF THE INVENTION

1. Field of the Invention

The invention relates to thermoelectric coolers, and more particularly, to improved structures and control circuitry for thermoelectric coolers.

2. Description of the Prior Art

Portable ice boxes or coolers are widely used by hunters, campers, fishermen, motorists, etc. However, such portable ice coolers are usually used because there are no better available alternatives to their use. Portable ice coolers have numerous shortcomings. For example, they are very heavy when loaded with ice. They become filled with water as the ice melts, sometimes causing perishables stored therein to become spoiled or become water logged. Frequently, it is very inconvenient for the prior ice coolers or even impossible to obtain more ice when it is needed, so perishables consequently become spoiled. It often is a bothersome task to chip or break an ice block so that it will fit into a particular cooler. Small, front-opening ice boxes frequently have been installed in recreational vehicles, and suffer from the same shortcomings. Further, with the advent of extremely high gasoline prices, nowadays every attempt is being made to reduce the overall weight of recreational vehicles. Thus, the high weight of ice for use in ice boxes is quite unacceptable in modern recreational vehicles. The high weight of compressor-type refrigerators or liquid propane powered refrigerators mitigates against their use in modern recreational vehicles. Further, the cost of compressor refrigerators or liquid propane powered portable refrigerators is very high.

Accordingly, it is an object of the invention to provide a convenient, low cost lightweight portable cooler.

Another object of the invention is to provide a low cost, lightweight, efficient refrigerator unit suitable for installation in recreational vehicles, which refrigerator unit is substantially lighter than liquid propane powered or compressor operated refrigerators.

A number of portable coolers or refrigerators utilizing solid state thermoelectric or Peltier elements have been utilized for refrigerating units, including portable refrigerating units. However, various difficulties have been encountered providing low cost thermoelectric refrigerating units, especially for use in units mounted in recreational vehicles. One prior unit for recreational vehicles provides both external and internal heat exchangers and a fan and control unit in the front door of the unit. This device has been found to be unsatisfactory for a number of reasons, including high weight of the door, and due to inefficient operation due to location of the internal heat exchanger in a location which is exposed to warm outside air when the door is opened.

Accordingly, it is another object of the invention to provide an improved thermoelectric refrigerator which can be conveniently installed in a recreational vehicle and which provides efficient operation utilizing only a single front ventilation grill.

Prior portable thermoelectric coolers or refrigerator units and also prior thermoelectric refrigerators designed for installation in recreational vehicles have utilized over-simplified control systems having various shortcomings. One shortcoming of prior control circuitry is that it does not provide suitable indication when a voltage of a battery powering the unit has fallen below a predetermined voltage level. Another shortcoming of prior control units is that they allow the devices to be only operated as coolers, whereas occasionally it is desirable that the unit be utilized to maintain the contents of the device at a predetermined warm temperature.

Accordingly, it is another object of the invention to provide an economical control system for a thermoelectric refrigerator which enables the thermoelectric refrigerator to operate as either a refrigerator or a heating device.

It is yet another object of the invention to provide a battery powered thermoelectric refrigerator having a control system which includes a convenient means of alerting the user of a low battery voltage condition.

Another shortcoming of previous thermoelectric refrigerators is that destruction of their control circuitry and also their solid state thermoelectric devices can occur if the external heat exchangers become too hot due to blockage of ventilation of the external heat exchangers.

Accordingly, it is another object of the invention to provide a thermoelectric refrigerator having control circuitry which prevents overheating of the external heat exchanger of the thermoelectric refrigerator.

A novelty search directed to the present invention uncovered the following patents, which are believed to accurately represent the state of the art pertinent to the invention: U.S. Pat. Nos. 4,007,600, 4,107,934, 3,194,023, 4,089,184, 4,055,053, 3,973,938, 3,839,876, 3,205,657, 3,171,261, 3,123,980, 3,121,998, 3,107,324, 3,077,079 and 3,031,855.

It is another object of the invention to provide an efficient, lightweight, inexpensive thermoelectric refrigerator unit which overcomes the shortcomings of the above prior art.

SUMMARY OF THE INVENTION

Briefly described, and in accordance with one embodiment thereof, the invention provides a portable thermoelectric cooler of the type having a hinged top. The cooler includes a storage compartment and an end recess covered by an end panel. The walls of the cooler are composed of rigid urethane foam covered with high impact ABS plastic. An internal heat exchanger is disposed in the storage compartment and is mounted on a wall thereof dividing the storage compartment from the end recess. A foam gasket is compressed between the base of the internal heat exchanger and the interior wall of the storage compartment. A pair of thermally conductive blocks extend through a pair of adjacent holes extending through the wall. The thermally conductive blocks intimately contact the base of the internal heat sink by means of thermal grease. An opposite end of each thermally conductive block intimately contacts one surface of a solid state thermoelectric device by means of thermal grease. A second flat surface of each solid state thermoelectric device contacts a separate external heat exchanger. The internal heat exchanger is composed of high thermal conductivity aluminum and has an extruded structure including a base section and a plurality of spaced, parallel fins. The external heat exchangers are also composed of high thermal conductivity aluminum, each including a plurality of spaced, parallel fins mounted in corresponding parallel slots in a base member. An electric fan and its motor are disposed in the end recess to draw relatively cool outside air into the end recess through a first grill opening. The fan forces the air through the fins of the external heat exchangers. After the air passes through the fins of the external heat exchangers, it passes out of the end recess through a second grill opening. The internal corners of the end recess are substantially rounded to promote efficient air transfer through the fins of the external heat exchangers.

A control circuit includes an on/off switch, a heat/cool switch, and a temperature control switch. The control circuit includes a thermistor mounted in one of the thermally conductive blocks adjacent to the corresponding thermoelectric module. A voltage produced in response to the first thermistor is amplified by a buffer amplifier and is compared to a reference voltage established by a temperature control knob and a potentiometer connected thereto in order to control a relay driver transistor. The transistor causes a relay to be actuated if the temperature sensed by the first thermistor exceeds a level established by the potentiometer. The two thermoelectric modules are connected in the series. The fan motor has one terminal connected to the anodes of a pair of steering diodes and another terminal connected to a voltage conductor. If the cool/heat switch is in its cooling position, the relay, when actuated by the relay drive transistor, applies a DC supply voltage provided by a battery to one end terminal of the pair of series-connected solid state thermoelectric devices and to a first one of the steering diodes. This causes the solid state thermoelectric devices to transfer heat from the internal heat exchanger to the external heat exchanger and also to energize the fan motor. When the temperature of the first thermister falls below the level set by the potentiometer, the first comparator switches, causing the relay to be de-actuated. This causes the pair of series-connected solid state thermoelectric devices and the fan motor to be electrically isolated from the DC supply voltage. If the cool/heat switch is in its heat position, the relay, when actuated, isolates the pair of series-connected solid state thermoelectric devices and the fan motor if the temperature of the first thermistor exceeds the temperature established by the potentiometer, and applies the DC supply voltage to a second end terminal of the pair of series-connected solid state thermoelectric devices and the anode of the second steering diode. This causes the pair of series-connected solid state thermoelectric devices to transfer heat from the external heat exchangers to the internal heat exchanger, increasing the temperature in the storage compartment. A second thermistor located adjacent to one of the external heat exchangers produces a voltage which causes a second comparator to override the first comparator if the temperature of the second thermistor exceeds a predetermined value, indicating overheating in the end recess. This prevents damage to the control circuitry and thermoelectric devices. A portion of the control circuitry senses the DC input voltage level, and causes a light emitting diode to emit continuous light if the applied DC battery voltage exceeds a predetermined value, and causes the light emitting diode to blink at a predetermined rate if the DC battery voltage is less than the predetermined value.

In one embodiment of the invention, the control circuitry is utilized in a front opening refrigerator suitable for mounting in recreational vehicles, remote cabins or the like. This structure includes a front mounting flange and a unitary front grill located above the front opening door. The fan and control circuitry are located within a top mounted housing bounded at one end by the front grill and having at its opposite end an air inlet, adjacent a fan. The external heat exchangers are located within the top mounted housing. The internal heat exchanger is attached to the top of the storage compartment. The fan draws air through the outer ends of the front grill, into the air inlet of the top mounted housing. The air passes through the fins of the external heat exchangers and out of the top mounted housing through the center portion of the front grill.

BRIEF DESCRIPTION OF THE DRAWINGS

FIG. 7 is a perspective view of a thermoelectric refrigerator unit suitable for installation in recreational vehicles.

FIG. 8 is a sectional view taken along section line 8—8 of FIG. 7.

FIG. 9 is a top view of the refrigerator of FIG. 7.

DESCRIPTION OF THE INVENTION

Figure 1:
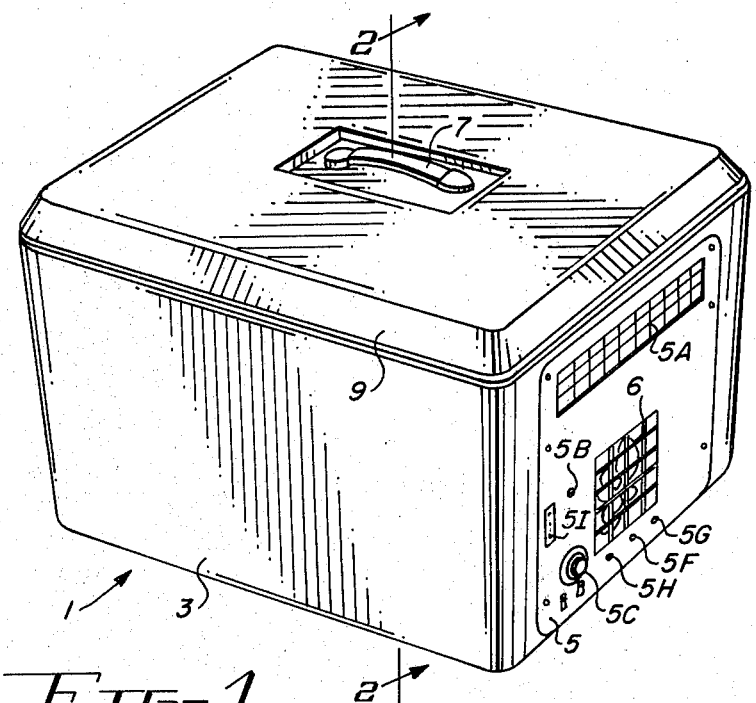
FIG. 1 is a perspective view of a portable thermoelectric refrigerator of the present invention.
Figure 2:
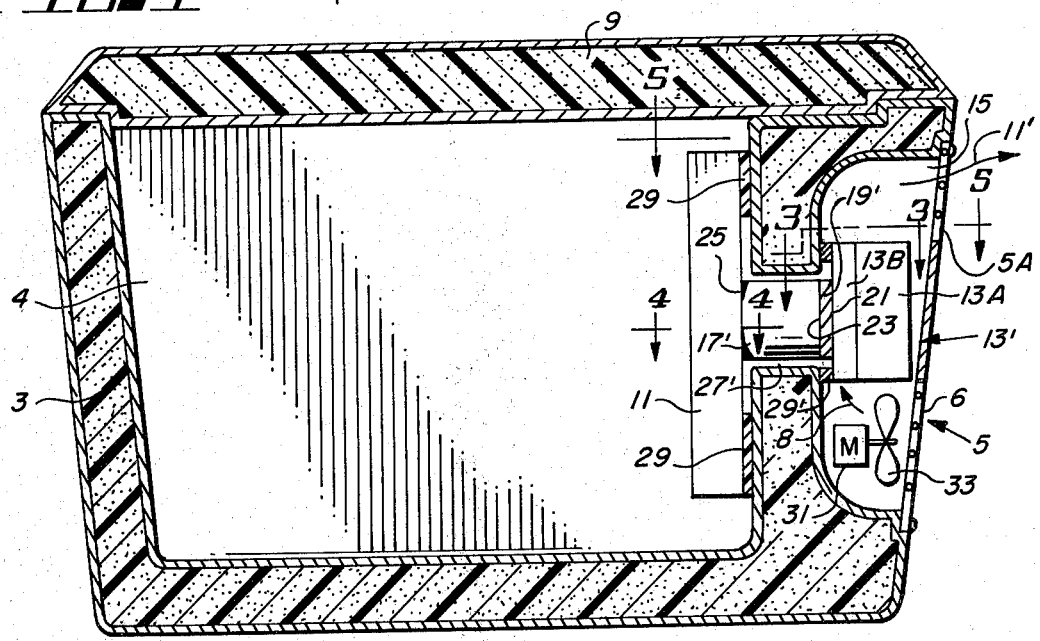
FIG. 2 is a sectional view taken along section line 2—2 of FIG. 1.
Figure 11:
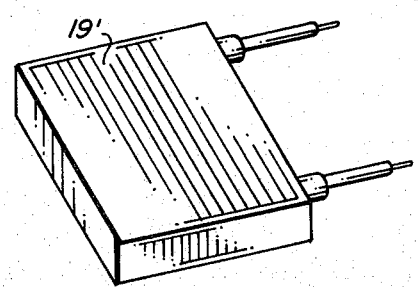
FIG. 11 is a perspective view of a thermoelectric element.

Referring to the drawings, particularly to FIGS. 1 and 2, a portable refrigerator or cooler 1 includes a lower section 3 which partially encloses a storage compartment 9 and a fan cavity or end recess 15. Top 9, having a handle 7 thereon, is hinged at one edge to lower section 3.

Both lower section 3 and top 9 are made of rigid urethane foam insulation and include inner and outer exposed surfaces covered by high impact ABS plastic.

The right end of portable refrigerator 1 has a unitary injection molded plastic end panel 5 which covers the open end of fan cavity 15 (see FIG. 2). An air outlet 5A disposed in the upper portion of end panel 5 includes a protective grill of injection molded plastic.

Figure 10:
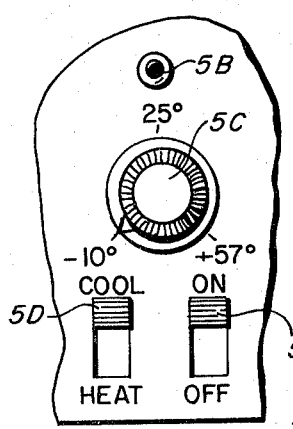
FIG. 10 is a front view of a control panel of the refrigerator unit of FIG. 1.
Figure 12:
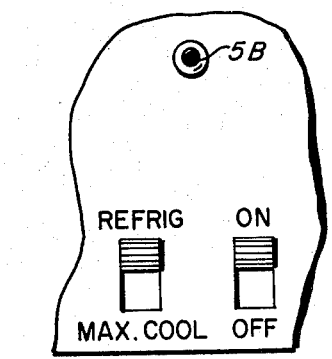
FIG. 12 is a front view of an alternate control panel for the refrigeration unit of FIG. 1.

A control section of end panel 5 includes a light emitting diode 5B, a control knob 5C, a cool/heat switch 5D, and an on/off switch 5E. FIG. 10 illustrates the physical proximity of light emitting diode 5B, control knob 5C, and switches 5D and 5E on end panel 5. FIG. 12 illustrates an alternate control panel section with no control knob, but having a thermostat on/off switch.

Figure 6:
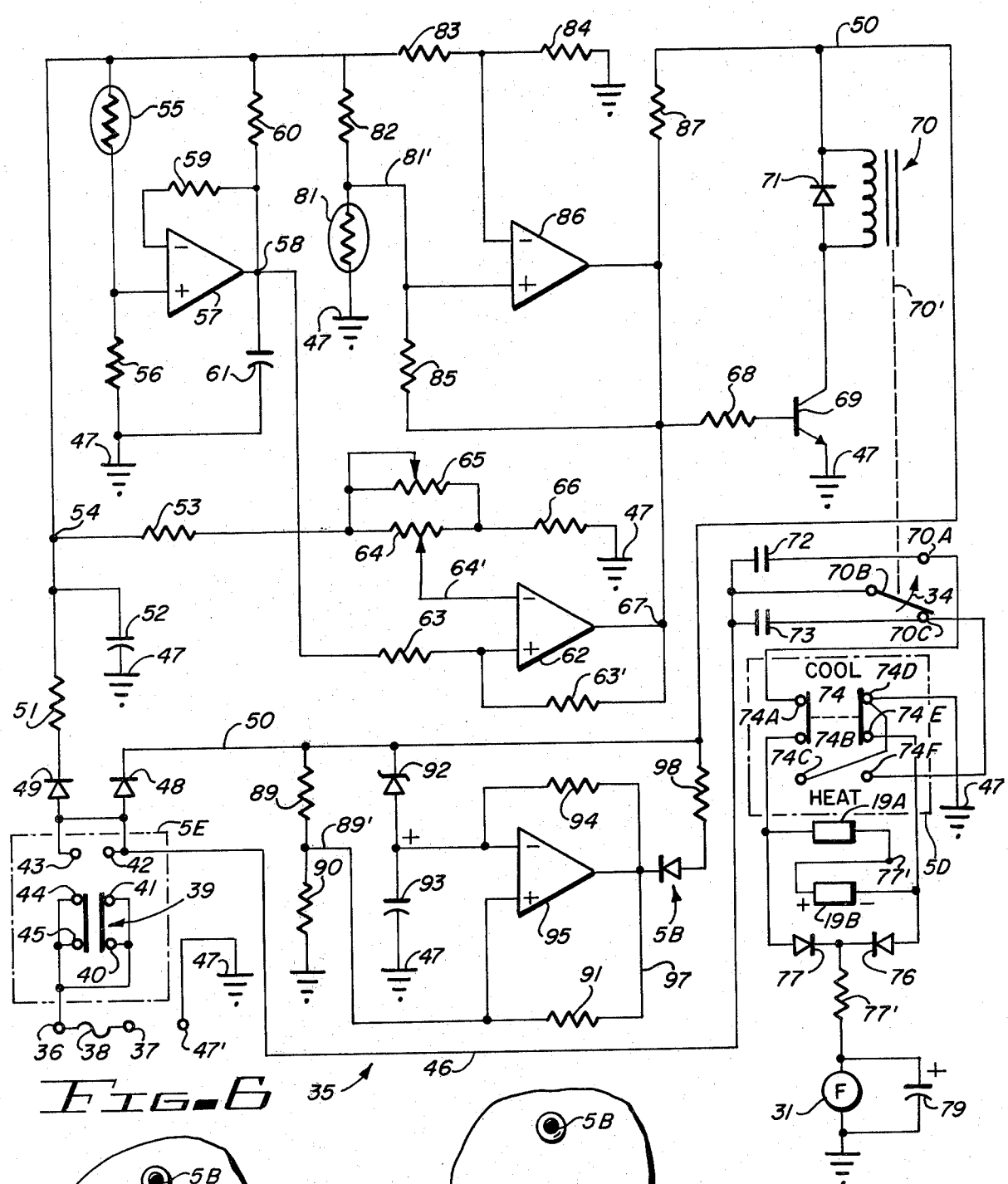
FIG. 6 is a schematic diagram of a control circuit utilized for the thermoelectric refrigerators of FIGS. 1 and 7.

A test point connector 51 is located on end panel 5 and includes 8 pins which are connected to 8 respective test points in the circuit of FIG. 6. (The test points includes nodes of conductors 69', 81', 54, 58, 97, 64', 77' and 47 in FIG. 6, and facilitate testing and troubleshooting of control circuitry 35 of FIG. 6.) An air inlet opening 6 in end panel 5 is covered by a plastic grill section of end panel 5. A fan 33, driven by motor 31 draws air through air inlet opening 6, and blows the air in the direction indicated by arrow 8, through the parallel fins of external heat exchanger 13', and out of air outlet opening 5A (which is also covered by a plastic grill section of end panel 5) in the direction indicated by arrow 11' in FIG. 2.

Fan cavity 15 has rounded corners to promote smooth flow of air drawn into fan cavity 15 by fan 8, thereby improving the operating efficiency of the unit.

Figure 5:
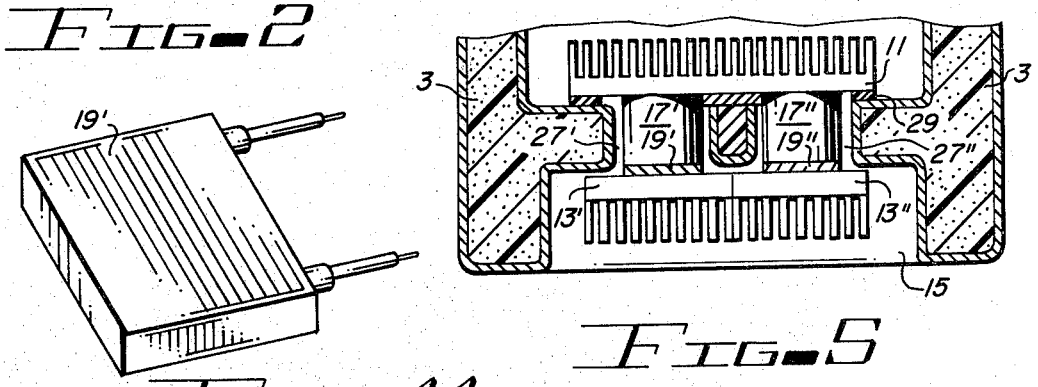
FIG. 5 is a partial sectional view taken along section line 5—5 of FIG. 2.

Referring now to FIGS. 2 and 5, internal heat exchanger 11 is mounted on the right wall of storage compartment 4. An airtight foam gasket 29 seals the base of internal heat exchanger 11 with respect to the surface of the inner wall of storage compartment 4.

A pair of thermally conductive blocks 17' and 17" each have a flat surface which is in intimate thermal contact with the flat base of internal heat exchanger 11. The intimate thermal contact is achieved by means of silicone thermal grease. For example, thermal grease is applied at junction 25 between the base of internal heat exchanger 11 and the adjoining surface of thermally conductive block 17', as shown in FIG. 2.

Thermally conductive blocks 17' and 17" extend, respectively, through close fitting openings 27' and 27" in the wall between storage compartment 4 and fan cavity 15. The outer surface of each of thermally conductive blocks 17' and 17" are in intimate thermal contact, respectively, with opposed surfaces of solid state thermoelectric devices 19' and 19"; silicone thermal grease is utilized to achieve such intimate thermal contact.

External heat exchangers 13' and 13" are located in fan cavity 15 and are in intimate thermal contact (again by means of silicone thermal grease) with the exposed surfaces of solid state thermoelectric devices 19' and 19". An airtight foam gasket 29' seals the base of external heat exchangers 13' and 13" with respect to surface of the outer wall surface of cavity 15.

Internal heat exchangers 11, external heat exchangers 13' and 13", and thermally conductive blocks 17' and 17" are composed of commercially available high thermal conductivity aluminum. Thermoelectric modules 19' and 19" are solid state devices which are based on the well known "Peltier effect" and are readily available commercially.

Figure 4:
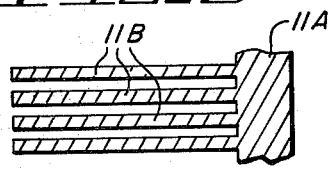
FIG. 4 is a partial sectional view taken along section line 4—4 of FIG. 2.

The cross-sectional structure of internal heat exchanger 11 is shown in FIG. 4, wherein it is seen that internal heat exchanger 11 includes a solid base section 11A and a plurality of integral parallel fins 11B. This structure, although expensive, is desirable in order to provide the strength and durability required for fins in storage compartment 4, as the fins may be subject to considerable stress due to shifting of heavy objects stored in storage compartment 4.

Figure 3:
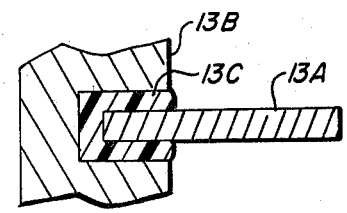
FIG. 3 is a partial sectional view taken along section line 3—3 of FIG. 2.

External heat exchangers 13' and 13" each have the cross-sectional structure partially shown in FIG. 3. Each external heat exchanger has a plurality of radiating fins 13A, each of which consists of a sheet of high thermal conductivity aluminum embedded in a corresponding slot of high thermal conductivity aluminum base 3B and held therein by means of thermally conductive epoxy 13C. This structure is substantially less expensive than the extruded structure of internal heat exchanger 11, and is satisfactory since external heat exchangers 13' and 13" are located within the protected confines of fan cavity 15.

The flatness of the surfaces through which heat is conducted by means of thermal grease, as explained above, must be maintained to within a tolerance of several thousandths of an inch.

Referring now to FIG. 6, a control circuit for operating the refrigerator of FIG. 1 includes double pole, double throw switch 5E, which includes terminals 40, 41, 42, 43, 44 and 45. Terminals 40, 41, 44 and 45 are connected to conductor 36, which is coupled by means of fuse 38 to voltage supply terminal 37. Voltage supply 37 is electrically connected to an ordinary 12 volt battery (not shown).

When switch 5E is in its "off" configuration, its slide plates are in the position shown in FIG. 6. If switch 5E is in its "on" configuration, one of its slide plates electrically connects terminals 43 and 44, and its other slide plate electrically connects terminals 42 and 41.

Protective diode 49 has its anode connected to terminal 43 and its cathode connected to one terminal of resistor 51. The other terminal of resistor 51 is connected to conductor 54. Capacitor 52 is connected between conductor 54 and ground conductor 47.

Thermistor 55, which is located on one of thermally conductive blocks 17' and 17" adjacent the point where that block makes thermal contact to the base of internal heat exchanger 11, has one terminal connected to conductor 54 and another terminal connected to the positive input of comparator 57. The output of comparator 57 is connected to conductor 58, which is coupled to the negative input of comparator 57 by means of resistor 59 and to conductor 54 by means of resistor 60. Capacitor 61 is connected between conductor 58 and ground conductor 47. Resistor 56 is connected between the positive input of comparator 57 and ground conductor 47.

Conductor 58 is connected to the positive input of comparator 62 by means of resistor 63. The negative input of comparator 62 is connected to the wiper of variable resistor 64. Variable resistor 64 is connected in parallel with variable resistor 65. Variable resistor 64 has one terminal connected to 66, the other terminal of which is connected to ground conductor 47. The other terminal of variable resistor 64 is connected to one terminal of resistor 53, the other terminal of which is connected to conductor 54. The output of comparator 62 is connected to conductor 67. Conductor 67 is connected by means of resistor 63' to the positive input of comparator 62.

Thermistor 81 is located very close to one of external heat exchangers 13' or 13" to detect overheating of the external heat exchangers. Thermister 81 has one terminal connected to ground conductor 47 and another terminal connected to conductor 81', which is connected to the positive input of comparator 86. Conductor 81' is coupled by means of resistor 82 to conductor 54 and by means of resistor 85 to conductor 67. The negative input of comparator 86 is coupled by means of resistor 83 to conductor 54 and by means of resistor 84 to ground conductor 47. The output of comparator 86 is connected to conductor 67. Conductor 67 is coupled to conductor 50 by means of resistor 87 which is also coupled to the base of relay drive transistor 69 by means of resistor 68. The emitter of relay drive transistor 69 is connected to ground conductor 47. The collector of relay drive transistor 69 is connected to one terminal of relay 70. Diode 71 is connected in parallel with the winding of relay 70, and has its cathode connected to conductor 50.

Relay 70 includes contact points 70A and 70C and a movable pole member 70B. Contact point 70A is coupled by means of capacitor 72 through conductor 46, which is connected to switch terminal 42 of switch 5E. Contact point 70C is coupled by means of capacitor 73 to conductor 46.

Double pole, double throw switch 5D includes terminals 74A, 74B, 74C, 74D, 74E and 74F and a pair of slide conductors mechanically connected together, as indicated by dotted line 74. Terminal 74A is connected to contact point 70A of relay 70. Terminal 74F of switch 5D is connected to contact point 70C of relay 70. Terminals 74C and 74D of switch 5D are connected together.

Terminal 74B of switch 5D is connected to the positive input of solid state thermoelectric device 19A, the negative terminal of which is connected to the positive input of thermoelectric device 19B.

Terminal 74E is connected to the negative terminal of thermoelectric device 19B.

Terminal 74E of switch 5D is connected to the anode of steering diode 76, the cathode of which is connected by means of resistor 77 to one terminal of fan motor 31. The other terminal of fan motor 31 is connected to ground conductor 47.

Terminal 74B of switch 5D is connected to the anode of steering diode 77, the anode of which is connected to the cathode of steering diode 76.

Referring to the left side of FIG. 6, protection diode 48 has its anode connected to terminal 42 of switch 5E and its cathode connected to conductor 50. Resistor 89 has one terminal connected to conductor 50 and another terminal connected to conductor 89'. Conductor 89' is connected by means of resistor 90 to ground conductor 47. Zener diode 92 has its cathode connected to conductor 50 and its anode connected to the positive input of comparator 95. The negative input of comparator 95 is coupled by means of capacitor 93 to ground conductor 47 and is coupled by means of resistor 94 to the cathode of light emitting diode 5B.

The output of comparator 95 is connected to the cathode of light emitting diode 5B (which was mentioned above with reference to end panel 5 of FIG. 1). The anode of light emitting diode 5B is connected to resistor 98. The positive input of comparator 95 is connected to conductor 89', which is coupled by means of resistor 91 to cathode of light emitting diode 5B. The anode of light emitting diode 5B is coupled by means of resistor 98 to conductor 50.

The circuitry of FIG. 6 is mounted on a small circuit board which is attached to the inner surface of end panel 5 (FIG. 1) by means of three stand-offs. Control knob 5C controls the resistance of adjustable resistor or potentiometer 65. Several test points of the circuit of FIG. 6 are connected to various pins of test socket 5D of FIG. 1.

Exemplary values of the resistors and capacitors in control circuitry 35 are listed below in TABLE 1:

TABLE 1

| resistor 56 | 10 KΩ | capacitor 61 | 4.7 μf |
|---|---|---|---|
| resistor 59 | 10 KΩ | capacitor 52 | 330 μf |
| resistor 60 | 2 KΩ | capacitor 93 | 10 μf |
| resistor 82 | 10 KΩ | capacitor 72 | 0.1 μf |
| resistor 83 | 10 KΩ | capacitor 73 | 0.1 μf |
| resistor 84 | 10 KΩ | capacitor 79 | 10 μf |
| resistor 85 | 150 KΩ | | |

TABLE 1-continued

| resistor 87 | 5.1 KΩ |
|---|---|
| resistor 68 | 5.1 KΩ |
| resistor 53 | 1.6 KΩ |
| resistor 66 | 1.1 KΩ |
| resistor 63 | 10 KΩ |
| resistor 63' | 150 KΩ |
| resistor 51 | 270 Ω |
| resistor 89 | 10 KΩ |
| resistor 90 | 10 KΩ |
| resistor 94 | 51 KΩ |
| resistor 91 | 10 KΩ |
| resistor 98 | 1 KΩ |
| resistor 77 | 27 KΩ |

Figure 13:
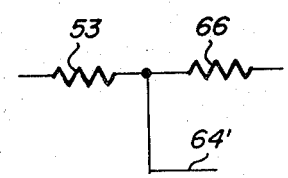
FIG. 13 is a fixed network for use in conjunction with the control panel of FIG. 12.

The operation of control circuit 35 is as follows. Assuming that refrigerator 1 is operating in its cooling mode, i.e., with cool/heat switch 5D in the configuration shown in FIG. 6, and assuming that the temperature in storage compartment 4 rises to a temperature higher than the temperature "set" by means of control knob 5C and variable resistor or potentiometer 65, (or the alternate fixed resistor divider network shown in FIG. 13) then thermistor 55 (which has a negative temperature coefficient) has a resistance which falls as the temperature in storage compartment 4 increases. Comparator 57 in combination with feedback resistor 59 and capacitor 61 operates as a linear, unity gain buffer amplifier. Since resistor 56 has a constant value, the voltage on the positive input of comparator 57 increases as the temperature in storage compartment 4 increases due to the reduction in resistance of thermistor 55. Consequently, the voltage on conductor 58 increases. This causes the voltage applied to the positive input of comparator 62 to increase. When the voltage at the positive input of comparator 62 exceeds the voltage at the negative input thereof (the negative input voltage of comparator 62 being set by a setting of control knob 5C) the output voltage of comparator 62 increases from approximately ground voltage to a high voltage, thereby driving current into the base of relay drive transistor 69. This turns relay 70 "on", causing pole member 70B of relay 70 to move in the direction indicated by arrow 34, causing pole member 70B to contact point 70A.

Since pole member 70B is connected by means of conductor 46 to a 12 volt DC source (i.e., a 12 volt battery connected between terminal 37 and ground conductor 47), switch terminals 74A and 74B, and consequently the positive terminal of thermoelectric device 19A and anode of extreme diode 77, are all connected to +12 volts. This causes fan 31 to operate, and causes thermoelectric devices 19A and 19B to conduct heat from internal heat exchanger 11 to external heat exchangers 13' and 13".

This causes internal heat exchanger 11 to become colder, thereby causing the resistance of thermistor 55 to increase. This decreases the voltage supplied to the positive input of comparator 57, causing the voltages on conductor 58 and the positive input of comparator 62 to decrease. When the voltage applied to the positive input of comparator 62 falls below the reference voltage applied to the negative input thereof, comparator 62 switches, turning off relay drive transistor 69. This turns relay 70 off, and pole member 70B returns to electrically contact point 70C. Contact 70C is connected only to contact point 74E, which is not connected to either the thermoelectric devices or the fan motor. Contact point 70A, and hence contact points 74A and 74B and the thermoelectric modules on fan motor, then are electrically disconnected from the +12 volt voltage on conductor 46.

Consequently, no cooling of internal heat exchanger 11 occurs, and the temperature of end storage compartment 4 and consequently the temperature of internal heat exchanger 11 gradually rises as heat is lost through the walls of thermoelectric refrigerator 1; the above described cycle is repeated.

If switch 5D is in its "heat" position, and if pole member 70B is in electrical contact with electrical contact point 70C, then one wiper of switch 5D electrically connects terminals 74B and 74C; the other wiper of switch 5D connects terminals 74E and 74F. In this event, when relay 70 is off (i.e., when the temperature in storage compartment 4 is higher than that set by control knob 5C and potentiometer 65 or fixed resistor divider network), the negative input of thermoelectric device 19B and the anode of sterring diode 76 are connected to conductor 46 and hence to the positive 12 volt battery voltage. This causes fan 31 to operate and causes thermoelectric modules 19A and 19B to conduct heat from external heat exchangers 13' and 13" to internal heat exchanger 11, thereby heating the storage compartment 4. When the temperature rises by a predetermined amount causing relay 70 to be turned on in the manner described above, then pole member 70B contacts contact point 70A, and thermoelectric modules 19A and 19B and fan motor 31 are electrically disconnected from the 12 volt battery voltage and remain in this condition until the temperature falls below the level set by potentiometer 65.

Comparators 57, 62, 86 and 95 can be implemented by use of a single Motorola MLM339P quad comparator integrated circuit. Relay 70 can be implemented by a Fujitsu FBR111UDO12-W twelve volt DC single pole, double throw, six ampere relay. Switches 5D and 5E are readily available commercially. Thermistor 55 can be a Western Thermistor A1070, and thermistor 81 can be a Western Thermistor 708C102.

The circuitry including resistors 89, 90, 94, 91 comparator 95, and zener diode 92 operate to control light emitting diode 5B so that light emitting diode 5B emits a steady glow when a proper polarity 12 volt battery voltage is applied between terminals 37 and 47' and emits a blinking light when the voltage falls below approximately 10.5 volts.

Protection diodes 48 and 49 provide protection for control circuit 35 in the event that an improper polarity battery voltage is connected between terminals 37 and 47'. If this happens, diode 48 and 49 are, of course, reversed biased, and none of the above described circuitry has the 12 volts applied thereto.

As the voltage on conductor 50 gradually decreases from roughly 12 volts, resistors 89 and 90 function as a voltage divider, applying a fixed proportion of decreasing voltage on conductor 50 to the positive input of the comparator 95. Meanwhile, a constant 6.8 volt drop occurs across zener diode 92 so that initially the voltage applied to the negative input of comparator 95 is greater than the voltage applied to the positive input thereof. However, when the voltage on conductor 50 falls below approximately 10.5 volts, the voltage applied to the negative input of comparator 95 falls below the voltage applied to the positive input of comparator 95. This causes comparator 95 to switch, so that its output increases from a relatively low voltage to a relatively high voltage.

When the output of comparator 95 is at the relatively low voltage, light emitting diode 5B emits light continually. However, when the output of comparator 95 switches, increasing to a relatively high voltage level, light emitting diode 5B turns off, and current then flows from conductor 50 through resistors 98 and 94, charging up capacitor 93. This causes the voltage of the negative input of comparator 95 to increase until comparator 95 switches so that its output voltage decreases to a relatively low voltage level, turning light admitting diode 5B back on. Thus, light emitting diode blinks at a slow rate (determined mainly by the values of resistor 94 and capacitor 93) as long as the battery voltage is less than approximately 10.5 volts.

Referring now to the circuitry including comparator 86, thermistor 81 (which senses the temperature in fan compartment 15 near external heat exchangers 13' and 13") and resistors 82, 83, 84 and 85, this circuitry "overrides" the operation of comparator 62 and its associated circuitry if the temperature in the fan compartment exceeds approximately 160 degrees Fahrenheit. (This situation can occur if refrigerator 1 is inadvertently placed so that there is inadequate circulation through either of air inlet opening 5A or air outlet opening 6 in FIG. 1).

As the temperature in fan compartment 15 exceeds approximately 160 degrees Fahrenheit, the resistance of thermistor 81 decreases, thereby decreasing the voltage on conductor 81' and decreasing the voltage on the positive input of comparator 86. When the voltage on the positive input of comparator 86 is less than the voltage determined by the voltage divider circuit including resistors 83 and 84, the output of comparator 86 decreases to approximately ground voltage, thereby turning relay drive transistor 69 off, thus "overriding" the output of comparator 62. This occurs because the connection of the outputs of comparators 86 and 62 by means of conductor 67 causes those two outputs to be "wire ANDED", as will be apparent to those skilled in the art.

Referring now to FIG. 7, built-in refrigerator unit 101 utilizes the same general operating components and structure as refrigerator 1 of FIG. 1. However, built-in refrigerator 101 is particularly adapted for installation in recreational vehicles. Built-in refrigerator 101 includes a main storage section 103 and a front opening door 109.

As shown in FIG. 7, a mounting flange 120 and a front grill 111 are utilized to mount refrigerator 101 in a precut opening in wall 13. Thus, refrigerator 101 can be utilized to replace a conventional ice box previously mounted into a pre-cut opening in wall 113. Mounting screws (not shown) are utilized to attach flange 120 to wall 113.

Referring now to FIGS. 7-9, a fan housing 115 encloses fan 119 and fan motor 119'. External heat exchanger 113 is oriented so that outside air is drawn into fan housing 115 through air inlet opening 117 therein and passes through the fins of external heat exchanger 113 toward front grill 111 and then passes out of fan housing 115 through the center portion of front grill 111, as indicated by arrows 123 in FIG. 9.

As seen in FIG. 9, air drawn into enclosure 115 is first drawn into the installation region to the left of wall 113' through the opposed end portions of front grill 111, as indicated by arrows 122. This air is then drawn around the left portions of the fan housing 115 and into air inlet opening 117, as indicated by arrows 121.

This structure has been found to be highly efficient and compact, enabling refrigerator 101 to be installed utilizing a single unitary front grill 111, thereby providing an attractive and easily installed refrigerator.

A pair of thermoelectric modules such as 19, heat conductive blocks such as 17, and an internal heat exchanger 11 are disposed in substantially the same manner as previously explained with reference to FIG. 2, except that they are mounted on the top of storage compartment 103.

Placement of the thermoelectric module and associated heat exchangers on the top of the regrigeration device results in improved cooling efficiency, since air cooled at the top of the storage compartment of regrigerator 101 naturally tends to sink to the bottom thereof, resulting in relatively uniform temperatures throughout the storage compartment of refrigerator 101. However, it should be noted that this method will work with thermoelectric modules and heat exchangers on the sides of refrigeration devices for special applications.

As before, rigid urethane foam is utilized as insulation for the various walls of refrigerator 101. High impact ABS plastic is utilized for the interior surfaces of refrigerator 101. The exterior surfaces of compartment 103 can be a less expensive material, such as heavy cardboard, since they are hidden from view after refrigerator 101 is installed in the pre-cut opening in wall 113'.

While the invention has been described with reference to several particular embodiments thereof, those skilled in the art will be able to readily make various obvious modifications to the described embodiments of the invention without departing from the true spirit and scope thereof, as set forth in the appended claims.

I claim:

1. In a thermoelectric refrigeration unit including
    i. a storage compartment,
    ii. a fan compartment for housing a fan and an external heat exchanger,
    iii. an internal heat exchanger located in the storage compartment, and
    iv. thermoelectric means for causing heat to flow from one to the other of the internal and external heat exchangers, said thermoelectric means having a first and second terminal,
control circuitry comprising in combination:
    a. first thermister circuit means for producing a first voltage representative of the actual temperature in the storage compartment;
    b. first circuit means for producing a second voltage representative of a desired temperature in the storage compartment;
    c. second circuit means coupled to said first thermister circuit means and said first circuit means for producing a third voltage if said second voltage exceeds said first voltage and producing a fourth voltage if said second voltage does not exceed said first voltage, said third and fourth voltages being at an output of said second circuit means;
    d. first switching means coupled to the output of said second circuit means and the first terminal of said thermoelectric means for
        i. electrically coupling the thermoelectric means to a voltage supply conductor to cause a current to flow into the first terminal of the thermoelectric means in response to said third voltage; and
        ii. electrically decoupling the first terminal of the thermoelectric means from said voltage supply conductor in response to said fourth voltage;
    e. third circuit means for causing said first switching means to prevent said first terminal of said thermoelectric means from being electrically coupled to said supply voltage conductor if a temperature in said fan compartment exceeds a predetermined level, said third circuit means being disposed in said fan compartment, wherein said thermoelectric refrigeration unit includes a pair of terminals for electrical connection to a DC voltage source, said first, second and third circuit means being coupled between said pair of terminals to effect energization of said first, second, and third circuit means;
    f. fourth circuit means for producing a first signal level if the voltage of said DC voltage source exceeds a predetermined level and for producing a signal which switches between said first signal level and a second signal level at a predetermined rate if the voltage of said DC voltage source is less than said predetermined level, said fourth circuit means including
        i. resistive divider means coupled between said pair of terminals for producing a fifth voltage representative of said voltage of said DC voltage source,
        ii. zener diode means coupled to one of said pair of terminals for establishing a reference voltage,
        iii. comparator means coupled to said resistive divider means and said zener diode means for comparing said fifth voltage with said reference voltage, said comparator means producing a first signal level when said fifth voltage is less than said reference voltage, said comparator means having an output and an input,
        iv. feedback circuit means coupled between said output and said input for producing a feedback signal to said input, and
        v. capacitive circuit means coupled to said feedback circuit means and responsive to said feedback signal for producing a periodic signal which varies at said predetermined rate on said input in response to said first signal level, said periodic signal causing said comparator means to switch the voltage level on said output between said first and second levels, said comparator means maintaining the voltage level of said output at said first level when said fifth signal level exceeds said reference voltage; and
    g. indicating means coupled to said output for producing a perceivable constant indication if the voltage of said DC source exceeds said predetermined level and a perceivable indication which varies at said predetermined rate if the voltage of said DC source is less than said predetermined level.

2. The control circuitry of claim 1 wherein said indicating means includes lamp means which becomes illuminated when said DC voltage source is correctly connected between said pair of terminals.

3. The control circuitry of claim 2 further including protective diode circuit means coupled between said pair of input terminals and said first, second, third, and fourth circuit means to prevent damage to said first, second, third and fourth circuit means if said DC voltage source is incorrectly connected to said pair of terminals.

4. The control circuitry of claim 1 wherein said first thermister circuit means includes a first thermister coupled in series with a first resistor between said pair of terminals and a unity gain amplifier coupled to the junction between said first thermister and said first resistor, said unity gain amplifier having an output producing a voltage equal to said first voltage.

5. The control circuitry of claim 4 wherein said first circuit means includes a variable resistor responsive to a manual temperature control of said thermoelectric refrigeration unit.

6. The control circuitry of claim 5 wherein said second circuit means includes a first comparator having a positive input responsive to said first voltage and a negative input responsive to said second voltage.

7. The circuitry of claim 6 wherein the output of said first comparator is wire ANDed with the output of said third circuit means.

8. The control circuitry of claim 1 wherein said first switching means includes a transistor having its base coupled to the output of said second circuit means, a relay being connected to the collector of said transistor.

9. The control circuitry of claim 8 further including second switch means coupled to said relay for coupling said voltage supply conductor to the first terminal of said thermoelectric means if said second switching means is in a first configuration and coupling said supply voltage conductor to a second terminal of said thermoelectric means if said second switching means is in a second configuration.

10. The control circuitry of claim 1 further including a test socket mounted on said thermoelectric refrigeration unit, said test socket having a plurality of pins connected, respectively, to a plurality of predetermined nodes of said control circuitry to effect testing of said thermoelectric refrigeration unit.

11. The control circuitry of claim 1 wherein said third circuit means includes thermister located adjacent to said external heat exchanger, said third circuit means also including fifth circuit means responsive to said thermister for producing a sixth voltage at the output of said second circuit means if said temperature in said fan compartment exceeds said predetermined level, said sixth voltage causing said first switching means to electrically decouple the first terminal of said thermoelectric means from being electrically coupled to said supply voltage conductor.

* * * * *